(12) United States Patent
Wong et al.

(10) Patent No.: US 7,056,724 B2
(45) Date of Patent: Jun. 6, 2006

(54) STORING DATA ENCODED DNA IN LIVING ORGANISMS

(75) Inventors: Pak C. Wong, Richland, WA (US); Kwong K. Wong, Sugar Land, TX (US); Harlan P. Foote, Richland, WA (US)

(73) Assignee: Battelle Memorial Institute, Richland, WA (US)

( * ) Notice: Subject to any disclaimer, the term of this patent is extended or adjusted under 35 U.S.C. 154(b) by 324 days.

(21) Appl. No.: 10/155,761

(22) Filed: May 24, 2002

(65) Prior Publication Data

US 2003/0219756 A1 Nov. 27, 2003

(51) Int. Cl.
*C12N 1/12* (2006.01)
*C12N 5/00* (2006.01)
*C07H 21/02* (2006.01)
*C07H 21/04* (2006.01)
*C01N 33/00* (2006.01)

(52) U.S. Cl. .................. 435/252.1; 435/325; 536/23.1; 536/24.2; 800/3

(58) Field of Classification Search .................... 800/3, 800/8, 21; 536/23.1, 242; 435/325, 252; 514/44
See application file for complete search history.

(56) References Cited

U.S. PATENT DOCUMENTS 4,704,362 A 11/1987 Itakura
5,787,032 A 7/1998 Heller et al. ................ 365/151

OTHER PUBLICATIONS

Steve Nadis, Science for Art's Sake, Nature, Oct. 12, 2000, vol. 407, pp. 668-670.
Joe Davis, Microvenus, Art Journal, vol. 55, I, Spring, 1996.
Joe Davis, Microvenus, CAA Draft, pp 70-74, Mar. 1995.
Shimanovsky, et al., Hiding Data in DNA, UCLA, 5th International Workshop in Information Hiding, Leeuwenhorst, The Netherlands, Oct. 2002.
Adleman, LM, "*Molecular Computation of Solutions to Comninatorial Problems*", p. 1020-1024. 1994.
Bass, TA, "*Gene Genie*", p. 1-8. 1995.
Benson, Y et al., "*Programmable and Autonomous Computing Machine Made of Biomolecules*", p. 430-434. 2001.
Cox, JPL, "*Long-Term Data Storage in DNA*", p. 247-250. 2001.
Clelland, CT et al., " *Hiding Messages in DNA Microdots*", p. 533-534. 1999.
Davis, J, "*New Media is Very Old*", p. 1-3. 2000.
Gibbs, WW, "*Art As a Form of Life*", p. 1-7. 2001.
Hapgood, F, "*Explanation of Molecular Computing with DNA*", p. 1-3. 1995.
Hoch, JA et al., "*Panspermia, spores and the Bacillus subtilis genome*" p. 237-238. 1997.
Johnson, RC, "*IBM Ace Has Nanotech Memory in Mind*", p. 1-6. 2000.
Langa, F, "*From QuBits to the Ultimate PC*", p. 1-2. 2000.
Leier, A et al., "*Cryptography with DNA Binary Strands*", p. 13-22. 2000.
Love JC et al., "Biochemical and DNA-Based Nanocomputers", p. 1-3. 2001.

(Continued)

*Primary Examiner*—Joseph Woitach
(74) *Attorney, Agent, or Firm*—Klarquist Sparkman LLP

(57) ABSTRACT

Current technologies allow the generation of artificial DNA molecules and/or the ability to alter the DNA sequences of existing DNA molecules. With a careful coding scheme and arrangement, it is possible to encode important information as an artificial DNA strand and store it in a living host safely and permanently. This inventive technology can be used to identify origins and protect R&D investments. It can also be used in environmental research to track generations of organisms and observe the ecological impact of pollutants. Today, there are microorganisms that can survive under extreme conditions. As well, it is advantageous to consider multicellular organisms as hosts for stored information. These living organisms can provide as memory housing and protection for stored data or information. The present invention provides well for data storage in a living organism wherein at least one DNA sequence is encoded to represent data and incorporated into a living organism.

25 Claims, 4 Drawing Sheets

OTHER PUBLICATIONS

Maley, CC, "DNA Computing: Theory, Practice, and Prospects", p. 3. 1998.

Markillie, LM et al., "*Targeted Mutagenesis by Duplication Insertion in the Radioresistant Bacteriu, Deinococcus Radiodurans: Radiation Sensitivities of Catalase (katA) and Superoxide Dismutase (sodA) Mutants*", p. 666-669. 1999.

Reaney, P, "*Scientists Build Tiny Computer from DNA*", p. 1-2. 2001.

Regalado, A, "*DNA Computing*", p. 1-7. 2000.

Ryder, OA et al., "*DNA Banks for Endangered Animal Species*", p. 275-277, 2000.

Wong, PC, "*Defense Advanced Research Projects Agency (DARPA)*", p. 1-6. 2001.

Wong PC et al., "*DNA Agents*", p. 1. 2001.

Recombinant DNA

STORING DATA ENCODED DNA IN LIVING ORGANISMS

This invention was made with Government support under Contract DE-AC0676RLO1830 awarded by the U.S. Department of Energy. The Government has certain rights in the invention.

FIELD OF THE INVENTION

The present invention relates generally to a method of storing data. In particular, but not exclusively, the present invention relates to storage of data as encoded DNA in living organisms.

BACKGROUND OF THE INVENTION

A data preservation problem looms large behind today's information superhighway. All current storage (e.g. paper, magnetic media, silicon chips) media require constant attention to maintain their information content. People or natural disasters can easily destroy all of them intentionally or accidentally. With the large amount of information generated by our society every day, it is time to think of a new generation of data memory.

The use of deoxyribonucleic acid (DNA) as a component of memory storage has been proposed for a number of reasons. For example, DNA as a memory medium is compact. One cubic centimeter of DNA in solution could store $10^{21}$ bits of information, whereas, a current conventional computer has a memory of at most $10^{14}$ bits. Also, most computers operate linearly, one block of data after another. Biochemical reactions are highly parallel in operation. That is a single biochemical operation can affect trillions of DNA strands in a test tube.

Heller et. al. (U.S. Pat. No. 5,787,032) describe the use of synthetic DNA polymers as an optical storage media for memory. Clelland et. al. reported in *Nature* (Vol. 399, 10 Jun. 1999, pp. 533–34 or www.nature.com) that encoding meaningful information as DNA sequences is possible. The authors conducted an experiment wherein an encoded DNA strand was hid behind a period (i.e., a dot) of a printed document. The document was then sealed and mailed to its owners using regular US Postal Service. The embedded message was successfully recovered in a lab environment. This work proved that a DNA strand can be a substitute for a piece of paper in terms of information storage. However, a naked DNA molecule can easily be destroyed when exposed to unfavorable environmental conditions such as excessive temperature or dessication/rehydration. Even nucleases in the environment may degrade the DNA molecules over time. Therefore, exploiting DNA as a memory medium would require an effective protective storage medium.

Establishing memory of stored information in a living organism can provide adequate protection for the encoded DNA strands. By providing a living host for the DNA—one that can tolerate the addition of "artificial" gene sequences and survive extreme environmental conditions. Perhaps more importantly, the host needs to be able to grow and multiply with the embedded information. Propagation of a host for memory embodied in DNA can allow for preservation and continuation of the stored memory, as well as protecting the integrity of the information contained in the memory. As well there is opportunity to utilize this capability to store purposeful information.

SUMMARY OF THE INVENTION

With a careful coding scheme and arrangement, applicants have invented a process to encode data or information as an artificial DNA strand and store it in a living host safely and permanently. The instant invention can be used to identify origins and protect R&D investments (i.e., DNA watermarking) such as agricultural products and rare animals. For example, the present invention allows for storage of data that comprises specific information about the host organism. The agricultural industry can use this invention to "label" crops. By storing various data regarding the particular plant, including origin, type, generation, etc., the agricultural industry can then rely on this information at a later date (e.g., when produce hits the market). It can also be used in environmental research to track generations of organisms and observe the ecological impact of pollutants. Today, there are microorganisms that can survive heavy radiation exposure, high temperatures, and many other extreme conditions. These hardy microorganisms can serve as memory hosts and protect the stored data or information. There are living organisms such as weeds and cockroaches that have existed on earth for hundreds of millions of years. These organisms are excellent candidates as well for preserving critical information for a future civilization.

Therefore, one embodiment of the present invention is a method of storing data in a living organism wherein at least one DNA sequence is encoded to represent data and incorporated into a living organism.

Another embodiment of the present invention is to provide sequences encoded to represent data with other sequences not specifically coded and incorporating them into a living organism for the purpose of memory storage.

Yet another embodiment of the present invention is to provide a method of storing programmed data into a living organism.

Still another embodiment of the present invention is to provide a memory storage system wherein DNA, encoded to represent data, is stored in a living organism.

Yet another embodiment of the present invention is to provide a method of storing editable data in a living organism.

Still another embodiment of the present invention is to provide a method of storing programmed data that responds to a stimulus into a living organism.

Yet another embodiment of the present invention is to provide a method of storing information that responds to a stimulus and reacts to specific encoded programming into a living organism.

Still another embodiment of the present invention is to provide a memory storage system wherein a living organism comprises at least one DNA sequence encoded to represent data, which is incorporated into the native DNA of a living organism.

BRIEF DESCRIPTION OF THE DRAWINGS

A more complete appreciation of the invention will be readily obtained by reference to the following Description and the accompanying drawings in which like numerals in different figures represent the same structures or elements, wherein.

DETAILED DESCRIPTION

The present invention comprises a method of storing data in a living organism, wherein at least one DNA sequence is encoded to represent data and is thereafter incorporated into the living organism. The method of the present invention comprises encoding DNA to represent specific data by selecting at least 2 of the four DNA nucleotide bases to represent specific text and arranging the nucleotide bases in a manner to represent the data. Encoding the DNA bases to represent specific data can be achieved in numerous and varied ways and the embodiments set forth herein are not meant to be exclusive, but rather exemplify the broader aspects inherent to the present invention.

Figure 1:
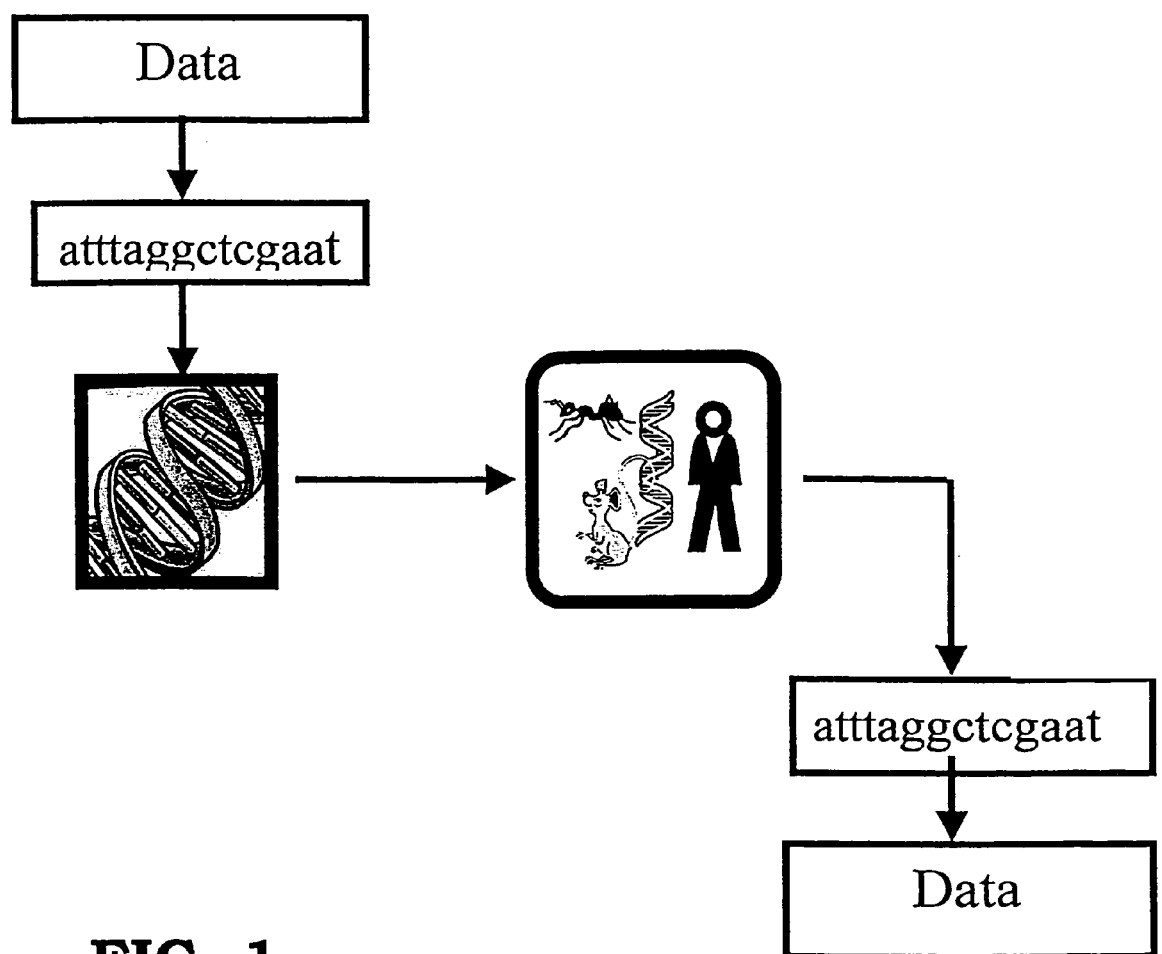
FIG. 1 is a simplified schematic diagram of the process of the present invention, wherein data is shown as being encode in the artificial sequence atttaggctcgaat (SEQ ID NO:1).

The present invention comprises a method of storing data in a living organism by incorporating encoded DNA into a viable cell of said living organism. FIG. 1 shows a simplified schematic of one aspect of the present invention. Firstly, the data to be stored is encoded into a DNA sequence. The four-nucleotide bases associated with a DNA sequence are assembled to represent the specific data by correlation with a specific code. For example, three of the four basic nucleotide bases (Cytosine or C, Guanine or G, Thymine or T and Adenine or A) can be assigned to represent a text character. A string of DNA nucleotide bases can then be assembled to represent text information or data. Once the specific data has been encoded into a DNA sequence, it is then inserting into a vector that will provide as a "vehicle" for transport into a living organism. A vector is a DNA molecule originating from a virus, a plasmid, the cell of a higher organism or synthetically assembled, into which another DNA fragment of appropriate size can be integrated without loss of the vectors capacity for self-replication; vectors introduce foreign DNA into host cells, where it can be reproduced in large quantities. Vectors can be selected from the group consisting of plasmids, cosmids, and yeast artificial chromosomes, and recombinant molecules containing DNA sequences. The vector comprising the encoded DNA is then introduced into a viable cell of a living organism. It is understood by those skilled in the art that DNA bases can be incorporated into a living cell in different ways and the particular vectors used and specific methodology is dependant upon the type of host cell. Once the vector is inside the cell of the host living organism, it can reside and be stored indefinitely. The vector DNA, along with the encoded DNA will be regenerated and coexist with the hosts genomic DNA.

The stored data can than be retrieved by means currently know by those skilled in the art. Stored data can be retrieved by standard PCR amplification method as PCR product (DNA fragment). Standard DNA sequencing method such as the dideoxy termination method can then identify the stored information within the amplified PCR product. Alternatively, stored information within the PCR product can be determined by hybridization with a panel of known oligonucleotides. Once the data is retrieved, it is then encoded and the original message is obtained.

Another aspect of the invention is to encode the DNA to represent data that is programmed data. The programmed data can then be programmed to accomplish an activity, continue a communication process, and even respond to a stimulus that will then result in an action. For example, we can construct a gene fusion between a hydrogen-peroxide-inducible promoter with a lysozyme gene, which will kill the bacteria if we add hydrogen peroxide to the engineered bacteria. We can also construct gene fusion with a regulatory gene, which will trigger a cascade of genetic responses (in our case is information). Gene fusions technique is a very common technique that has been used in studying bacterial gene regulation such as the use of green fluorescent protein.

The living organism utilized in the present invention can be single-celled or multi-cellular, prokaryotic or eukaryotic. Although bacterial cells serve well as host organisms to demonstrate the present invention, it is understood that other living cells can be utilized as well.

Another aspect of the present invention is the storage of data in multicellular living organisms. This embodiment of the present invention can be achieved by incorporating at least one DNA sequence encoded to represent data into a germ cell; a precursor cell that gives rise to gametes that will then serve as specialized haploid cells (sperm or egg) in sexual reproduction, or stem cell; a relatively undifferentiated cell that will continue dividing indefinitely, throwing off (producing) daughter cells that will undergo terminal differentiation into particular cell types. The encoded DNA sequence will then propagate into a multicellular living organism. This embodiment of the invention is a memory storage system that takes advantage of multicellular organisms (e.g., insect, rodent) and serves to propagate the encoded DNA sequence in all daughter cells stemming from the original host stem cell.

The present invention comprises a memory storage system wherein a living organism comprises therein at least one DNA sequence encoded to represent data. The stored data resides in a living organism and remains there until recovery is desired. The data is then retrieved and decoded so as to enable communication. Like a computer memory device that can store data and programs, the present invention comprises the same or similar items in a DNA memory system. Unlike a computer compiled software program, a program in a DNA memory system can comprise a set of rules, options, or instructions that respond to specific circumstantial or environmental conditions. In other words, the living organism will detect stimuli condition as well as react according to the information or instructions encoded in the DNA sequence. The host cell of the living organism should not express the non-native encoded DNA (artificial to the genomic DNA of the organism) and cause destructive consequences such as toxic effects. It is desired to custom-design an encoded DNA sequence that will respond to specific events and cause the host cell of the living organism to react or change. Therefore, the present invention provides a unique nano-scaled event detection tool that will detect and respond to a plurality of stimuli based on the programming encoded into the DNA that is incorporated into a host cell of a living organism.

For a clear and concise understanding of the specification and claims, including the scope given to such terms, the following definitions are provided:

As used herein, the word ENCODE means to express given data or information by means of a code.

As used herein, the word DATA means Information of any form that is used for communication, analysis, and or reasoning in making decisions.

Cells to be used as a carrier of the encoded DNA needs to be made competent using standard methods and will uptake the encoded DNA molecules. This can be achieved by either chemical transformation or electroporation methods.

EXAMPLE 1

DNA Host Identification—Two well-understood bacteria, *Escherichia coli* (*E. coli*) and *Deinococcus radiodurans* (*D. radiodurans*), were utilized for our experiment. We selected *E. coli* and *D. radiodurans* because microorganisms, in general, grow very rapidly and the embedded information can be inherited rapidly and continuously. *Deinococcus*, survive extreme conditions such as ultraviolet, desiccation, partially vacuum environments, and ionizing radiation up to 1.6 million Rad (about 0.1% of the same radiation dose would be fatal to human beings). Some strains of Deinococcus can also tolerate high temperature. Although bacteria were chosen as preferred embodiments, it is understood that any living cell, whether single-celled or multicellular organism, can be used in the use of this invention.

Information Encoding—A (Adenine), C (Cytosine), G (Guanine), and T (Thymine) were used to assemble a DNA sequence information stream to represent data. Table 1 depicts the encoding key for a set of triplets—a DNA sequence with any 3 of the 4 basic units. It is recognized that other types and methods of coding information can be utilized and this example is not meant to be exclusive to this invention.

TABLE 1

DNA encoding table

| | | | | | | | |
|---|---|---|---|---|---|---|---|
| AAA-0 | AAC-1 | AAG-2 | AAT-3 | ACA-4 | ACC-5 | ACG-6 | ACT-7 |
| AGA-8 | AGC-9 | AGG-A | AGT-B | ATA-C | ATC-D | ATG-E | ATT-F |
| CAA-G | CAC-H | CAG-I | CAT-J | CCA-K | CCC-L | CCG-M | CCT-N |
| CGA-O | CGC-P | CGG-Q | CGT-R | CTA-S | CTC-T | CTG-U | CTT-V |
| GAA-W | GAC-X | GAG-Y | GAT-Z | GCA-SP | GCC-: | GCG-, | GCT-- |
| GGA-. | GGC-! | GGG-( | GGT-) | GTA-` | GTC-' | GTG-" | GTT-" |
| TAA-? | TAC-; | TAG-/ | TAT-[ | TCA-] | TCC- | TCG- | TCT- |
| TGA- | TGC- | TGG- | TGT- | TTA- | TTC- | TTG- | TTT- |

Unique DNA Searching—the entire genomic sequence of *E. coli* and *D. radiodurans* are known. A number of fixed-size sequence (20-base pairs) were identified, Several criteria were used to identify these set of 20-mers. 1. these sequence do not exist in either *Deinococcus radioduran* or *Escherchia coli* genome; 2, the 20-mer will not have complimentary sequence with more than four bases at the 3' end, e.g -AATT or -CCGG at 3' end; 3. the GC content of the 20-mer will be in the range of 40 to 60%; 4. the 20-mer will have at least any two of TAG, TAA or TGA stop codons. Criteria 1 to 3 will provide unique tags for subsequent PCR retrieval of encoded DNA, while criterion 4 will prevent the formation of fusion proteins that may be detrimental to the host bacterium. These sequences ensure that no unnecessary mutations or damage to the bacteria result. The sequences will serve as sentinels to tag the beginning and end of the embedded messages-similar to the file header and footer in a magnetic tape—for later identification and retrieval. Of the 10 billion potential candidates in the bacterium *Deinococcus*, we found only 25 qualified sequences that are acceptable for our experiments. A brutal force computational analysis is used to compute this set of 20-mers. There is $4^{20}$ combinations of 20-mers. All the 20-mers do not have GC content (% of G or C within the 20-mer) between 40–60% were eliminated, and then the 4.1 million 20-mer exist in Deinococcus radiodurans were eliminated. Finally, sequences with complementary 3' end (-AATT, -TTAA, -GGCC, -CCGG, -ATAT, -TATA, -GCGC, -CGCG), were eliminated. The remaining 20-mer was searched for the presence of stop codons. The sequences shown in Table 2 are the identified DNA sequences used to design oligonucleotides (oligos) used herein. Multiple stop codons (i.e., triplets such as TAA, TGA, and TAG) are present in many of the sequences. These codons discourage the host from "reading" the non-native DNA that has been encoded to represent data, and subsequently producing chimeric proteins that may be harmful to the bacteria.

TABLE 2

25 20-base Pair Sequences Utilzed Herein.

SEQ ID NO.: 2
AAGGTAGGTAGGTTAGTTAG

SEQ ID NO.: 3
AGGTTTGGTGGTATAGTTAG

TABLE 2-continued 25 20-base Pair Sequences Utilzed Herein.

SEQ ID NO.: 4
ATAGGAGTGTGTGTAGTTAG

SEQ ID NO.: 5
ATATTAGAGGGGGTAGTTAG

SEQ ID NO.: 6
GGAGTAGTGTGTATAGTTAG

SEQ ID NO.: 7
GGGAGTATGTAGTTAGTTAG

SEQ ID NO.: 8
GGTTAGATGAGTGTAGTTAG

TABLE 2-continued

25 20-base Pair Sequences Utilzed Herein.

SEQ ID NO.: 9
TAAGGGATGTGTGTAGTTAG

SEQ ID NO.: 10
TAGAGGAGGGATATAGTTAG

SEQ ID NO.: 11
TAGATGGGAGGTATAGTTAG

SEQ ID NO.: 12
TAGGAGAGATGTGTAGTTAG

SEQ ID NO.: 13
TATAGGGAGGGTATAGTTAG

SEQ ID NO.: 14
TGTGGGATAGTGATAGTTAG

SEQ ID NO.: 15
AGAGTAGTGAGGATAGTTAG

SEQ ID NO.: 16
ATAAGTAGTGGGGTAGTTAG

SEQ ID NO.: 17
ATAGGGGTATGGATAGTTAG

SEQ ID NO.: 18
ATGGGTGGATTGATAGTTAG

SEQ ID NO.: 19
GGGAATAGAGTGTTAGTTAG

SEQ ID NO.: 20
GGGATGATTGGTTTAGTTAG

SEQ ID NO.: 21
GTATGGGAATGGTTAGTTAG

SEQ ID NO.: 22
TAGAGAGAGTGTGTAGTTAG

SEQ ID NO.: 23
TAGAGTGGTGTGTTAGTTAG

SEQ ID NO.: 24
TAGATTGGATGGGTAGTTAG

SEQ ID NO.: 25
TAGGGTTGGTAGTTAGTTAG

SEQ ID NO.: 26
TATAGGGTAGGGTTAGTTAG

Laboratory Procedures and Results

Figure 2:
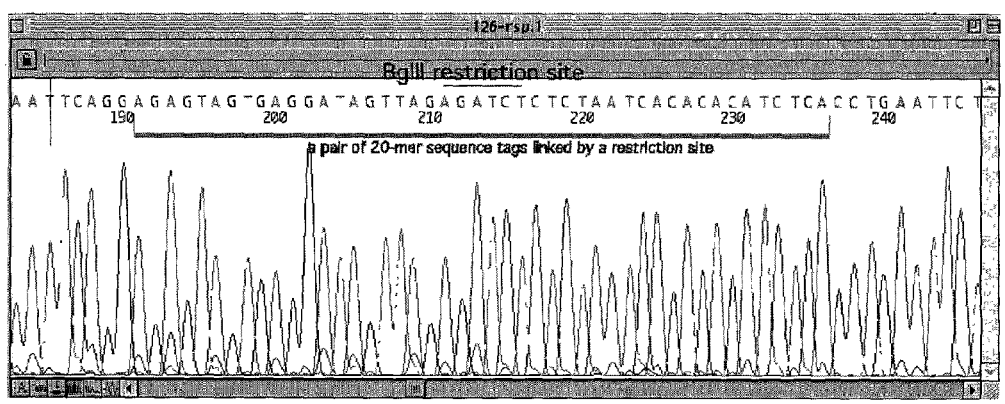
FIG. 2 is an illustration of a portion of a plasmid vector having inserted therein a 46-base pair DNA fragment (SEQ ID NO:26) that includes a pair of 20-mer sequence tags linked by a restriction site, as described in the examples.
Figure 3:
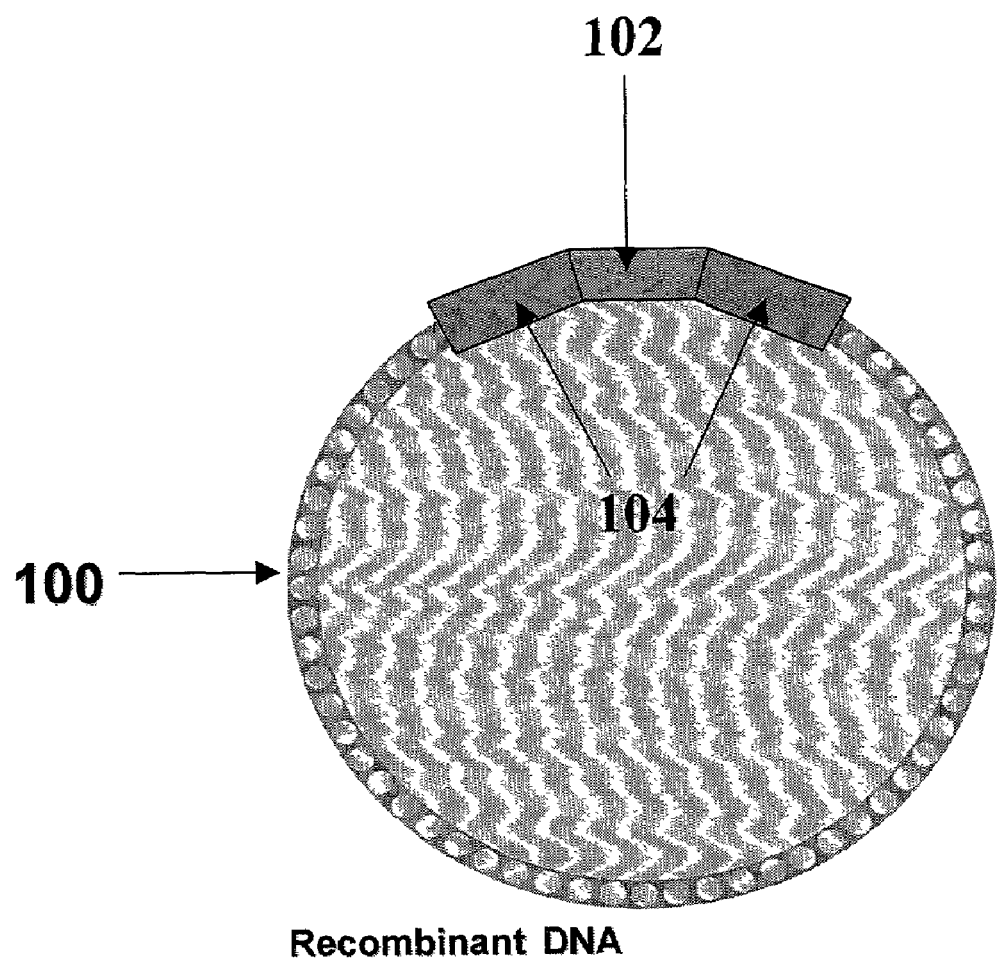
FIG. 3 is a graphical illustration of the encoded DNA sequence and the decoded message.

Two 46-mer complementary oligos were created, each comprising two different 20-mer oligos connected by a 6-base pair long restriction enzyme site. The two 20-mer oligos were created from two different sequences listed in Table 2. The restriction enzyme site was to prepare for later encoded DNA fragment insertion. These two 46-mer long complementary oligos form a double stranded 46-base pair DNA fragment. The DNA fragment was then cloned into a recombinant plasmid as illustrated in FIG. 3 where two 20-mer long oligos 104 serve as "sentinels placed at the beginning and end of the inserted encoded DNA 102, which was then incorporated into plasmid vector 100. Because the two 20-mer oligos do not exist in the genome of the host, they served as identification markers for later message retrieval. The stop codons in these two oligos also help protect the message as well as the host from any potential damage. Table 3 shows the phrases considered for insertion, along with their respectively coded sequences. For this experiment, each phrase used (2, 3, 4, 5, 8, 9, 11) was inserted into a different single cell of *D. radians*. The present invention can be practiced such that all of the desired phrases are inserted into the same single cell or individual phase can be inserted into different cell. Two complimentary oligos (5'AGAGTAGTGAGGATAGTTA-GAGATCTCTCTAATCACACACATCTCA3', SEQ ID NO.: 27 and 5'TGAGATGTGTGTGATTA-GAGAGATCTCTAACTATCCTCACTACTCT3'), SEQ ID NO.: 28 containing two arbitrarily chosen 20-mer tags (5'AGAGTAGTGAGGATAGTTAG3', SEQ ID NO.: 29 5'TGAGATGTGTGTGATTAGAG3'), SEQ ID NO.: 30 arbitrarily selected from Table 2, were chemically synthesized. These two chemically synthesized oligos (46-mer) were allowed to anneal to each other to form a 46 bp DNA fragment, which was cloned into a cloning vector, pCR-blunt (InVitrogen Inc.). A BglII restriction enzyme site, AGATCT, was built in within 46 bp DNA fragment. As a result, encoded DNA message can be cloned into the BlgII site by standard cloning procedure, and the message can be retrieved with that pairs of tags or primer pairs present within the plasmid vector. (See FIG. 2)

TABLE 3

Stored Data Utilized Herein

1 A WORLD OF TEARS,
2 AND A GOLDEN SUN,
3 AND A SMILE MEANS
4 AND A WORLD OF FEARS,
5 AND THE OCEANS ARE WIDE,
6 FRIENDSHIP TO EVERYONE,
7 IT IS TIME WE'RE AWARE.
8 IT'S A SMALL SMALL WORLD.
9 IT'S A SMALL WORLD AFTER ALL,
10 IT'S A WORLD OF HOPES
11 IT'S A WORLD OF LAUGHTER,
12 IT'S SMALL SMALL WORLD.
13 THERE IS JUST ONE MOON
14 THERE'S SO MUCH THAT WE SHARE,
15 THOUGH THE MOUNTAINS ARE HIGH,

TABLE 3-continued

Stored Data Utilized Herein

SEQ ID NO.: 31
1 AACGCAAGGGCAGAACGACGTCCCATCGCACGAATTGCACTCATGAGGCGTCTAGCG

SEQ ID NO.: 32
2 AAGGCAAGGCCTATCGCAAGGGCACAACGACCCATCATGCCTGCACTACTGCCTGCG

SEQ ID NO.: 33
3 AATGCAAGGCCTATCGCAAGGGCACTACCGCAGCCCATGGCACCGATGAGGCCTCTA

SEQ ID NO.: 34
4 ACAGCAAGGCCTATCGCAAGGGCAGAACGACGTCCCATCGCACGAATTGCAATTATGAGGCGTCTAGCG

SEQ ID NO.: 35
5 ACCGCAAGGCCTATCGCACTCCACATGGCACGAATAATGAGGCCTCTAGCAAGGCGTATGGCAGAACAGATCATGGCG

SEQ ID NO.: 36
6 ACGGCAATTCGTCAGATGCCTATCCTACACCAGCGCGCACTCCGAGCAATGCTTATGCGTGAGCGACCTATGGCG

SEQ ID NO.: 37
7 ACTGCACAGCTCGCACAGCTAGCACTCCAGCCGATGGCAGAAATGGTCCGTATGGCAAGGGAAAGGCGTATGGGA

SEQ ID NO.: 38
8 AGAGCACAGCTCGTCCTAGCAAGGGCACTACCGAGGCCCCCCGCACTACCGAGGCCCCCCGCAGAACGACGTCCCATCGGA

SEQ ID NO.: 39
9 AGCGCACAGCTCGTCCTAGCAAGGGCACTACCGAGGCCCCCCGCAGAACGACGTCCCATCGCAAGGATTCTCATGCGTGCAAGGCCCCCCGCG

SEQ ID NO.: 40
10 AACAAAGCACAGCTCGTCCTAGCAAGGGCAGAACGACGTCCCATCGCACGAATTGCACACCGACGCATGCTA

SEQ ID NO.: 41
11 AACAACGCACAGCTCGTCCTAGCAAGGGCAGAACGACGTCCCATCGCACGAATTGCACCCAGGCTGCAACACCTCATGCGTGCG

SEQ ID NO.: 42
12 AACAAGGCACAGCTCGTCCTAGCACTACCGAGGCCCCCCGCACTACCGAGGCCCCCCGCAGAACGACGTCCCATCGGA

SEQ ID NO.: 44
13 AACAATGCACTCCACATGCGTATGGCACAGCTAGCACATCTGCTACTCGCACGACCTATGGCACCGCGACGACCT

SEQ ID NO.: 45
14 AACACAGCACTCCACATGCGTATGGTCCTAGCACTACGAGCACCGCTGATACACGCACTCCACAGGCTCGCAGAAATGGCACTACACAGGCGTATGGCG

SEQ ID NO.: 46
15 AACACCGCACTCCACCGACTGCAACACGCACTCCACATGGCACCGCGACTGCCTCTCAGGCAGCCTCTAGCAAGGCGTATGGCACACCAGCAACACGCG

The embedded DNA (Table 3) was then inserted into a plasmid vector 100, shown in FIG. 3. The resultant vectors are then transferred into *E. coli* by electroporation (high-voltage shocks). It is recognized by one of ordinary skill in the art to transfer vectors by other means that may be more particularly suited for the specific host cell. For example, we have used pCRblunt for cloning most of the specifically designed oligos. As bacteria grow and divide, the recombinant plasmid vectors also replicate to produce an enormous number of copies of DNA plasmid vectors containing the encoded DNA. This produces multiple copies of the encoded DNA fragment, allowing storage and continuation of the stored data.

Figure 4:
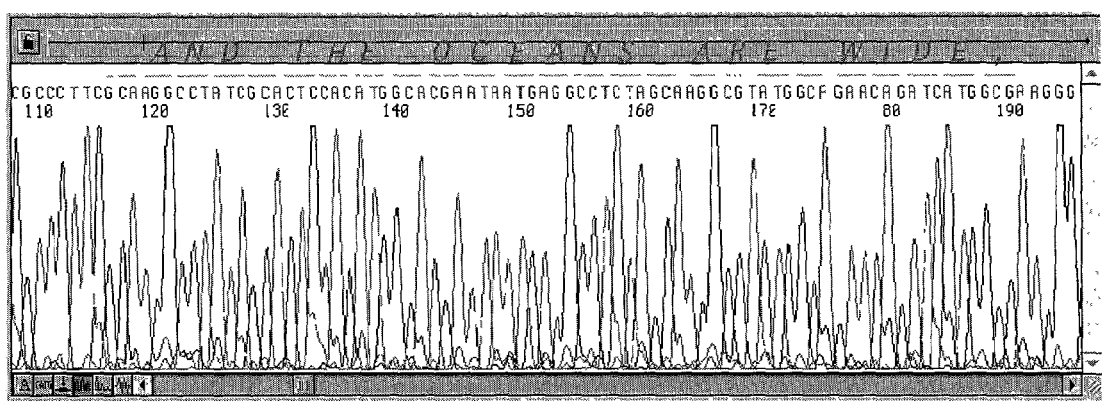
FIG. 4 shows an example of a DNA sequence of a song phrase in the context of a plasmid vector, as described in the examples.

The stored data was then recovered by searching for the two 20-mer oligos (data markers) 104 (FIG. 3). The cells were harvested then lysed to obtain crude genomic DNA comprising the incorporated encoded DNA. With standard procedures, the encoded DNA was located and amplified with polymerase chain reaction (PCR) techniques. Specific primers (M13 reverse, TGAGCGGATAACAAITTCACA-CAG, SEQ ID NO:47 or M13 sequencing primer, GTTTTC-CCCAGTCACGACGTTG), SEQ ID NO:48 or a pair of tag primers (FIG. 2) can be used to amplify the encoded DNA as PCR DNA fragment. Once the encoded information was obtained, it was then decoded to reveal the original data (song phrases). FIG. 4 shows an example of a DNA sequence of a song phrase recovered and the decoded message revealed. We use a simple script to convert DNA sequence into words based on our assignment of each of the triplets. We have data from *E. coli* only although we have tried once with *D.radiodurans* but not successful yet.

Although the invention has been described with respect to specific preferred embodiments, many variations and modifications may become apparent to those skilled in the art. It is therefore the intention that the appended claims be interpreted as broadly as possible in view of the prior art to include all such variations and modifications.

The invention claimed is:

1. A method of storing data in *Deinococcus radians*, comprising the steps of:
    performing an evaluation of a genome of said *Deinococcus radians* relative to one or more criteria for use as a storage medium;
    preparing a code based on the evaluation;
    encoding at least one DNA sequence in accordance with the code to represent said data; and
    incorporating said at least one encoded DNA sequence into *Deinococcus radians*.

2. A method according to claim 1 wherein encoding comprises,
    a. providing said data represented as text data, and
    b. translating said text data by means of a code to DNA comprising the steps of:
        i. selecting at least two of the four DNA nucleotide bases to represent specific text, and
        ii. arranging said nucleotide bases to represent said text data.

3. A method according to claim 2 wherein 3 of the four DNA nucleotide bases are selected.

4. A method according claim 2 wherein four DNA nucleotide bases are selected.

5. A method according to claim 1 wherein said incorporating comprises transfecting a viable cell of said *Deinococcus radians* with said encoded DNA.

6. The method according to claim 5 wherein said transfecting a viable cell with encoded DNA comprises the steps of:
    a. inserting said encoded DNA into a vector; and
    b. introducing said vector into said viable cell.

7. The method according to claim 1 wherein said data is recovered.

8. The method according to claim 7 wherein said recovered data is decoded.

9. The method according to claim 1 wherein said data is programmed data.

10. The method according to claim 9 wherein said programmed data responds to at least one stimulus.

11. The method of claim 1, wherein the code includes an identification marker determined with the evaluation.

12. A method, comprising:
    providing information for storage in a memory;
    encoding the information in a DNA sequence;
    selecting *Deinococcus radians* to protect the DNA sequence from an environmental condition detrimental to the DNA sequence if exposed thereto;
    storing the DNA sequence in the *Deinococcus radians* serving as the memory;
    preserving the DNA sequence in the *Deinococcus radians* until recovery of the information is desired; and
    at a later date when the recovery is desired, recovering the information from the *Deinococcus radians*.

13. The method of claim 12, which includes:
    evaluating a genome of the *Deinococcus radians* to determine a storage code,
    wherein the code includes an identification marker selected based on evaluation of the genome; and
    applying the storage code to perform the encoding of the information in the DNA sequence.

14. The method of claim 12, which includes providing a label for a product with the information stored in the *Deinococcus radians*.

15. The method of claim 12, which includes tracking material with the information stored in the *Deinococcus radians*.

16. The method of claim 12, wherein said recovering includes cloning the *Deinococcus radians* to identify the DNA sequence.

17. A method, comprising:
    establishing data for storage in a memory;
    utilizing a *Deinococcus radians* to serve as the memory and a storage code determined from analysis of genomic information about the living organism;
    encoding the data in a DNA sequence in accordance with the storage code; and storing the DNA sequence in the *Deinococcus radians* serving as the memory to preserve the data.

18. The method of claim 17, which includes recovering the data from the *Deinococcus radians* at a later date.

19. The method of claim 18, wherein the analysis of the genomic information includes evaluating the genomic information relative to multiple criteria to maintain viability of the *Deinococcus radians*.

20. The method of claim 17, which includes providing a label for a product with the data stored in the *Deinococcus radians*.

21. The method of claim 17, wherein the storage code includes an identification marker determined with the analysis.

22. A method, comprising:
   establishing information for storage in a memory;
   encoding the information in a DNA sequence;
   storing the DNA sequence in *Deinococcus radian*; and
   providing a label with the information stored in the *Deinococcus radians*.

23. The method of claim 22, which includes recovering the information from the *Deinococcus radians* at a later date.

24. The method of claim 22, which includes tracking material with the information stored in the *Deinococcus radians*.

25. The method of claim 22, wherein the encoding is performed with a storage code and the storage code is determined from analysis of a genome of the *Deinococcus radians*.

* * * * *

UNITED STATES PATENT AND TRADEMARK OFFICE
CERTIFICATE OF CORRECTION

PATENT NO. : 7,056,724 B2
APPLICATION NO. : 10/155761
DATED : June 6, 2006
INVENTOR(S) : Pak C. Wong et al.

It is certified that error appears in the above-identified patent and that said Letters Patent is hereby corrected as shown below:

In the Drawings:

Figure 4, below the DNA sequence, "80" should read --180--.

Column 1, line 37, "et. al." should read --et al.--.

Column 1, line 39, "et. al." should read --et al.--.

Column 1, line 58, "strands. By" should read --strands by--.

Column 2, line 64, "being encode" should read --being encoded--.

Column 3, line 5, "sequence of a" should read --sequence (SEQ ID NO: 34) of a--.

Column 3, line 35, "then inserting" should read --then inserted--.

Column 3, line 41, "vectors capacity" should read --vector's capacity--.

Column 3, line 54, "hosts genomic" should read --host's genomic--.

Column 3, line 55, "can than be" should read --can then be--.

Column 3, line 56, "know by" should read --known by--.

Column 4, line 66, "DNA needs to" should read --DNA need to--.

Table 1, line 6, " GTG–" " should read -- GTG–" --

Column 5, line 49, "identified, Several" should read --identified. Several--.

Column 5, line 50, "20-mers. 1" should read --20-mers - 1--.

Column 5, line 51, "sequence do not" should read --sequences do not--.

Column 5, line 52, "genome; 2, the" should read --genome; 2. the--.

Column 5, line 54, "e.g -AATT" should read --e.g. -AATT--.

Column 6, line 3, "the 20-mers do not" should read --the 20-mers that do not--.

UNITED STATES PATENT AND TRADEMARK OFFICE
CERTIFICATE OF CORRECTION

PATENT NO. : 7,056,724 B2
APPLICATION NO. : 10/155761
DATED : June 6, 2006
INVENTOR(S) : Pak C. Wong et al.

It is certified that error appears in the above-identified patent and that said Letters Patent is hereby corrected as shown below:

Column 6, line 5, "20-mer exist in" should read --20-mers that exist in--.

Column 8, line 13, "as "sentinels placed" should read --as "sentinels" placed--.

Column 8, line 28, "phase can be" should read --phrases can be--.

Column 8, line 28, "different cell." should read --different cells.--.

Column 8, lines 35-36, "GAGAGATCTCTAACTATCCTCACTACTCT3'), SEQ ID NO.:28 containing" should read

-- GAGAGATCTCTAACTATCCTCACTACTCT3', SEQ ID NO.:28)

containing--.

Column 8, line 37, "SEQ ID NO.: 29" should read --SEQ ID NO.: 29 and--.

Column 8, line 38, "5'TGAGATGTGTGTGATTAGAG3'), SEQ ID NO.: 30" should read -- 5'TGAGATGTGTGTGATTAGAG3', SEQ ID NO.: 30)--.

Column 8, line 46, "BlgII" should read --Bg1II--.

Column 8, line 48, "pairs of tags" should read --pair of tags--.

Table 3, line 12, "IT'S SMALL" should read --IT'S A SMALL--.

UNITED STATES PATENT AND TRADEMARK OFFICE
CERTIFICATE OF CORRECTION

PATENT NO. : 7,056,724 B2
APPLICATION NO. : 10/155761
DATED : June 6, 2006
INVENTOR(S) : Pak C. Wong et al.

It is certified that error appears in the above-identified patent and that said Letters Patent is hereby corrected as shown below:

Column 10, line 45, "TGAGCGGATAACAAITTCACA" should read

--TGAGCGGATAACAATTTCACA--.

Signed and Sealed this

Twenty-fourth Day of July, 2007

JON W. DUDAS
*Director of the United States Patent and Trademark Office*

SEQUENCE LISTING

<160> NUMBER OF SEQ ID NOS: 46

<210> SEQ ID NO 1
<211> LENGTH: 32
<212> TYPE: DNA
<213> ORGANISM: Deinococcus radiodurans

<400> SEQUENCE: 1
aattttaagg ccccggatat tatagcgccg cg                          32

<210> SEQ ID NO 2
<211> LENGTH: 20
<212> TYPE: DNA
<213> ORGANISM: Artificial Sequence
<220> FEATURE:
<223> OTHER INFORMATION: Synthesized Oligo A

<400> SEQUENCE: 2
aaggtaggta ggttagttag                                        20

<210> SEQ ID NO 3
<211> LENGTH: 20
<212> TYPE: DNA
<213> ORGANISM: Artificial Sequence
<220> FEATURE:
<223> OTHER INFORMATION: Synthesized Oligo B

<400> SEQUENCE: 3
aggtttggtg gtatagttag                                        20

<210> SEQ ID NO 4
<211> LENGTH: 20
<212> TYPE: DNA
<213> ORGANISM: Artificial Sequence
<220> FEATURE:
<223> OTHER INFORMATION: Synthesized Oligo C

<400> SEQUENCE: 4
ataggagtgt gtgtagttag                                        20

<210> SEQ ID NO 5
<211> LENGTH: 20
<212> TYPE: DNA
<213> ORGANISM: Artificial Sequence
<220> FEATURE:
<223> OTHER INFORMATION: Synthesized Oligo D

<400> SEQUENCE: 5
atattagagg gggtagttag                                        20

<210> SEQ ID NO 6
<211> LENGTH: 20
<212> TYPE: DNA
<213> ORGANISM: Artificial Sequence
<220> FEATURE:
<223> OTHER INFORMATION: Synthesized Oligo E

<400> SEQUENCE: 6
ggagtagtgt gtatagttag                                        20

<210> SEQ ID NO 7
<211> LENGTH: 20
<212> TYPE: DNA
<213> ORGANISM: Artificial Sequence

```
<220> FEATURE:
<223> OTHER INFORMATION: Synthesized Oligo F

<400> SEQUENCE: 7
gggagtatgt agttagttag                                          20

<210> SEQ ID NO 8
<211> LENGTH: 20
<212> TYPE: DNA
<213> ORGANISM: Artificial Sequence
<220> FEATURE:
<223> OTHER INFORMATION: Synthesized Oligo G

<400> SEQUENCE: 8
ggttagatga gtgtagttag                                          20

<210> SEQ ID NO 9
<211> LENGTH: 20
<212> TYPE: DNA
<213> ORGANISM: Artificial Sequence
<220> FEATURE:
<223> OTHER INFORMATION: Synthesized Oligo H

<400> SEQUENCE: 9
agagtagtga ggatagttag                                          20

<210> SEQ ID NO 10
<211> LENGTH: 20
<212> TYPE: DNA
<213> ORGANISM: Artificial Sequence
<220> FEATURE:
<223> OTHER INFORMATION: Synthesized Oligo I

<400> SEQUENCE: 10
ataagtagtg gggtagttag                                          20

<210> SEQ ID NO 11
<211> LENGTH: 20
<212> TYPE: DNA
<213> ORGANISM: Artificial Sequence
<220> FEATURE:
<223> OTHER INFORMATION: Synthesized Oligo J

<400> SEQUENCE: 11 atagggtat ggatagttag                                           20

<210> SEQ ID NO 12
<211> LENGTH: 20
<212> TYPE: DNA
<213> ORGANISM: Artificial Sequence
<220> FEATURE:
<223> OTHER INFORMATION: Synthesized Oligo K

<400> SEQUENCE: 12
atgggtggat tgatagttag                                          20

<210> SEQ ID NO 13
<211> LENGTH: 20
<212> TYPE: DNA
<213> ORGANISM: Artificial Sequence
<220> FEATURE:
<223> OTHER INFORMATION: Synthesized Oligo L

<400> SEQUENCE: 13
gggaatagag tgttagttag                                          20
```

<210> SEQ ID NO 14
<211> LENGTH: 20
<212> TYPE: DNA
<213> ORGANISM: Artificial Sequence
<220> FEATURE:
<223> OTHER INFORMATION: Synthesized Oligo M

<400> SEQUENCE: 14
gggatgattg gtttagttag                                         20

<210> SEQ ID NO 15
<211> LENGTH: 20
<212> TYPE: DNA
<213> ORGANISM: Artificial Sequence
<220> FEATURE:
<223> OTHER INFORMATION: Synthesized Oligo N

<400> SEQUENCE: 15
gtatgggaat ggttagttag                                         20

<210> SEQ ID NO 16
<211> LENGTH: 20
<212> TYPE: DNA
<213> ORGANISM: Artificial Sequence
<220> FEATURE:
<223> OTHER INFORMATION: Synthesized Oligo O

<400> SEQUENCE: 16
taagggatgt gtgtagttag                                         20

<210> SEQ ID NO 17
<211> LENGTH: 20
<212> TYPE: DNA
<213> ORGANISM: Artificial Sequence
<220> FEATURE:
<223> OTHER INFORMATION: Synthesized Oligo P

<400> SEQUENCE: 17
tagaggaggg atatagttag                                         20

<210> SEQ ID NO 18
<211> LENGTH: 20
<212> TYPE: DNA
<213> ORGANISM: Artificial Sequence
<220> FEATURE:
<223> OTHER INFORMATION: Synthesized Oligo Q

<400> SEQUENCE: 18
tagatgggag gtatagttag                                         20

<210> SEQ ID NO 19
<211> LENGTH: 20
<212> TYPE: DNA
<213> ORGANISM: Artificial Sequence
<220> FEATURE:
<223> OTHER INFORMATION: Synthesized Olgo R

<400> SEQUENCE: 19
taggagagat gtgtagttag                                         20

<210> SEQ ID NO 20
<211> LENGTH: 20
<212> TYPE: DNA
<213> ORGANISM: Artificial Sequence
<220> FEATURE:
<223> OTHER INFORMATION: Synthesized Oligo S

```
<400> SEQUENCE: 20
tatagggagg gtatagttag                                              20

<210> SEQ ID NO 21
<211> LENGTH: 20
<212> TYPE: DNA
<213> ORGANISM: Artificial Sequence
<220> FEATURE:
<223> OTHER INFORMATION: Synthesized Oligo T

<400> SEQUENCE: 21
tgtgggatag tgatagttag                                              20

<210> SEQ ID NO 22
<211> LENGTH: 20
<212> TYPE: DNA
<213> ORGANISM: Artificial Sequence
<220> FEATURE:
<223> OTHER INFORMATION: Synthesized Oligo U

<400> SEQUENCE: 22
tagagtggtg tgttagttag                                              20

<210> SEQ ID NO 23
<211> LENGTH: 20
<212> TYPE: DNA
<213> ORGANISM: Artificial Sequence
<220> FEATURE:
<223> OTHER INFORMATION: Synthesized Oligo V

<400> SEQUENCE: 23
tagattggat gggtagttag                                              20

<210> SEQ ID NO 24
<211> LENGTH: 20
<212> TYPE: DNA
<213> ORGANISM: Artificial Sequence
<220> FEATURE:
<223> OTHER INFORMATION: Synthesized Oligo W

<400> SEQUENCE: 24
tagggttggt agttagttag                                              20

<210> SEQ ID NO 25
<211> LENGTH: 20
<212> TYPE: DNA
<213> ORGANISM: Artificial Sequence
<220> FEATURE:
<223> OTHER INFORMATION: Synthesized Oligo X

<400> SEQUENCE: 25
tatagggtag ggttagttag                                              20

<210> SEQ ID NO 26
<211> LENGTH: 46
<212> TYPE: DNA
<213> ORGANISM: Artificial Sequence
<220> FEATURE:
<223> OTHER INFORMATION: Complimentary Oligo A

<400> SEQUENCE: 26
agagtagtga ggatagttag agatctctct aatcacacac atctca                 46

<210> SEQ ID NO 27
```

```
<211> LENGTH: 46
<212> TYPE: DNA
<213> ORGANISM: Artificial Sequence
<220> FEATURE:
<223> OTHER INFORMATION: Complimentary Oligo B

<400> SEQUENCE: 27
tgagatgtgt gtgattagag agatctctaa ctatcctcac tactct        46

<210> SEQ ID NO 28
<211> LENGTH: 20
<212> TYPE: DNA
<213> ORGANISM: Artificial Sequence
<220> FEATURE:
<223> OTHER INFORMATION: Arbitrary Chosen 20-mer Tag A

<400> SEQUENCE: 28
agagtagtga ggatagttag        20

<210> SEQ ID NO 29
<211> LENGTH: 20
<212> TYPE: DNA
<213> ORGANISM: Artificial Sequence
<220> FEATURE:
<223> OTHER INFORMATION: Arbitrary Chosen 20-mer Tag B

<400> SEQUENCE: 29
tgagatgtgt gtgattagag        20

<210> SEQ ID NO 30
<211> LENGTH: 57
<212> TYPE: DNA
<213> ORGANISM: Artificial Sequence
<220> FEATURE:
<223> OTHER INFORMATION: Line #1 Encoded Information

<400> SEQUENCE: 30
aacgcaaggg cagaacgacg tcccatcgca cgaattgcac tcatgaggcg tctagcg        57

<210> SEQ ID NO 31
<211> LENGTH: 57
<212> TYPE: DNA
<213> ORGANISM: Artificial Sequence
<220> FEATURE:
<223> OTHER INFORMATION: Line #2 Encoded Information

<400> SEQUENCE: 31
aaggcaaggc ctatcgcaag ggcacaacga cccatcatgc ctgcactact gcctgcg        57

<210> SEQ ID NO 32
<211> LENGTH: 57
<212> TYPE: DNA
<213> ORGANISM: Artificial Sequence
<220> FEATURE:
<223> OTHER INFORMATION: Line #3 Encoded Information

<400> SEQUENCE: 32
aatgcaaggc ctatcgcaag ggcactaccg cagcccatgg caccgatgag gcctcta        57

<210> SEQ ID NO 33
<211> LENGTH: 69
<212> TYPE: DNA
<213> ORGANISM: Artificial Sequence
<220> FEATURE:
<223> OTHER INFORMATION: Line #4 Encoded Information

<400> SEQUENCE: 33
```
acagcaaggc ctatcgcaag ggcagaacga cgtcccatcg cacgaattgc aattatgagg    60
cgtctagcg                                                            69

<210> SEQ ID NO 34
<211> LENGTH: 78
<212> TYPE: DNA
<213> ORGANISM: Artificial Sequence
<220> FEATURE:
<223> OTHER INFORMATION: Line #5 Encoded Information

<400> SEQUENCE: 34
accgcaaggc ctatcgcact ccacatggca cgaataatga ggcctctagc aaggcgtatg    60
gcagaacaga tcatggcg                                                  78

<210> SEQ ID NO 35
<211> LENGTH: 75
<212> TYPE: DNA
<213> ORGANISM: Artificial Sequence
<220> FEATURE:
<223> OTHER INFORMATION: Line #6 Encoded Information

<400> SEQUENCE: 35
acggcaattc gtcagatgcc tatcctacac cagcgcgcac tccgagcaat gcttatgcgt    60
gagcgaccta tggcg                                                     75

<210> SEQ ID NO 36
<211> LENGTH: 75
<212> TYPE: DNA
<213> ORGANISM: Artificial Sequence
<220> FEATURE:
<223> OTHER INFORMATION: Line #7 Encoded Information

<400> SEQUENCE: 36
actgcacagc tcgcacagct agcactccag ccgatggcag aaatggtccg tatggcaagg    60
gaaaggcgta tggga                                                     75

<210> SEQ ID NO 37
<211> LENGTH: 81
<212> TYPE: DNA
<213> ORGANISM: Artificial Sequence
<220> FEATURE:
<223> OTHER INFORMATION: Line #8 Encoded Information

<400> SEQUENCE: 37
agagcacagc tcgtcctagc aagggcacta ccgaggcccc ccgcactacc gaggcccccc    60
gcagaacgac gtcccatcgg a                                              81

<210> SEQ ID NO 38
<211> LENGTH: 93
<212> TYPE: DNA
<213> ORGANISM: Artificial Sequence
<220> FEATURE:
<223> OTHER INFORMATION: Line #9 Encoded Information

<400> SEQUENCE: 38
agcgcacagc tcgtcctagc aagggcacta ccgaggcccc ccgcagaacg acgtcccatc    60
gcaaggattc tcatgcgtgc aaggcccccc gcg                                 93

<210> SEQ ID NO 39
<211> LENGTH: 72
<212> TYPE: DNA

```
<213> ORGANISM: Artificial Sequence
<220> FEATURE:
<223> OTHER INFORMATION: Line #10 Encoded Information

<400> SEQUENCE: 39
aacaaagcac agctcgtcct agcaagggca gaacgacgtc ccatcgcacg aattgcacac    60
cgacgcatgc ta                                                       72

<210> SEQ ID NO 40
<211> LENGTH: 84
<212> TYPE: DNA
<213> ORGANISM: Artificial Sequence
<220> FEATURE:
<223> OTHER INFORMATION: Line #11 Encoded Information

<400> SEQUENCE: 40
aacaacgcac agctcgtcct agcaagggca gaacgacgtc ccatcgcacg aattgcaccc    60
aggctgcaac acctcatgcg tgcg                                          84

<210> SEQ ID NO 41
<211> LENGTH: 78
<212> TYPE: DNA
<213> ORGANISM: Artificial Sequence
<220> FEATURE:
<223> OTHER INFORMATION: Line #12 Encoded Information

<400> SEQUENCE: 41
aacaaggcac agctcgtcct agcactaccg aggcccccg cactaccgag gcccccgca     60 gaacgacgtc ccatcgga                                                 78

<210> SEQ ID NO 42
<211> LENGTH: 75
<212> TYPE: DNA
<213> ORGANISM: Artificial Sequence
<220> FEATURE:
<223> OTHER INFORMATION: Line #13 Encoded Information

<400> SEQUENCE: 42
aacaatgcac tccacatgcg tatggcacag ctagcacatc tgctactcgc acgacctatg    60
gcaccgcgac gacct                                                    75

<210> SEQ ID NO 43
<211> LENGTH: 99
<212> TYPE: DNA
<213> ORGANISM: Artificial Sequence
<220> FEATURE:
<223> OTHER INFORMATION: Line # 14 Encoded Information

<400> SEQUENCE: 43
aacacagcac tccacatgcg tatggtccta gcactacgag caccgctgat acacgcactc    60
cacaggctcg cagaaatggc actacacagg cgtatggcg                          99

<210> SEQ ID NO 44
<211> LENGTH: 99
<212> TYPE: DNA
<213> ORGANISM: Artificial Sequence
<220> FEATURE:
<223> OTHER INFORMATION: Line # 15 Encoded Information

<400> SEQUENCE: 44
aacaccgcac tccaccgact gcaacacgca ctccacatgg caccgcgact gcctctcagg    60
cagcctctag caaggcgtat ggcacaccag caacacgcg                          99
```

```
<210> SEQ ID NO 45
<211> LENGTH: 24
<212> TYPE: DNA
<213> ORGANISM: Artificial Sequence
<220> FEATURE:
<223> OTHER INFORMATION: M13 Reverse Primer (PCR Amplification Primer)

<400> SEQUENCE: 45
tgagcggata acaatttcac acag                                            24

<210> SEQ ID NO 46
<211> LENGTH: 22
<212> TYPE: DNA
<213> ORGANISM: Artificial Sequence
<220> FEATURE:
<223> OTHER INFORMATION: M13 Sequence Primer (PCR Amplification Primer)

<400> SEQUENCE: 46
gttttcccca gtcacgacgt tg                                              22
```